(12) United States Patent
Vallely (10) Patent No.: US 10,749,281 B1
(45) Date of Patent: Aug. 18, 2020

(54) SHEAR AND TORQUE RESISTANT F-CONNECTOR ASSEMBLY

(71) Applicant: Genesis Technology USA, Inc., Lawrenceville, GA (US)

(72) Inventor: William Gray Vallely, Johns Creek, GA (US)

(73) Assignee: Genesis Technology USA, Inc., Lawrenceville, GA (US)

( * ) Notice: Subject to any disclaimer, the term of this patent is extended or adjusted under 35 U.S.C. 154(b) by 0 days.

(21) Appl. No.: 16/366,221

(22) Filed: Mar. 27, 2019

Related U.S. Application Data (60) Provisional application No. 62/726,678, filed on Sep. 4, 2018.

(51) Int. Cl.
| | | |
|---|---|---|
| *H01R 9/05* | (2006.01) | |
| *H01R 13/66* | (2006.01) | |
| *H01R 43/00* | (2006.01) | |

(52) U.S. Cl.
CPC ............ *H01R 9/05* (2013.01); *H01R 9/0512* (2013.01); *H01R 9/0524* (2013.01); *H01R 9/0527* (2013.01); *H01R 13/66* (2013.01); *H01R 43/00* (2013.01)

(58) Field of Classification Search
CPC .......... H01R 9/032; H01R 9/034; H01R 9/05; H01R 9/0512; H01R 9/0515; H01R 9/0524; H01R 9/16; H01R 12/598; H01R 13/648; H01R 13/658; H01R 13/66; H01R 24/38; H01R 33/20; H01R 33/205
See application file for complete search history.

(56) References Cited

U.S. PATENT DOCUMENTS

| | | | | |
|---|---|---|---|---|
| 5,137,470 A | * | 8/1992 | Doles ................... | H01R 24/564 439/578 |
| 5,720,630 A | * | 2/1998 | Richmond ......... | H01R 13/2414 439/591 |
| 5,730,612 A | * | 3/1998 | Tatsuzuki ............... | H01R 24/46 439/188 |
| 5,795,188 A | * | 8/1998 | Harwath .............. | H01R 9/0524 439/583 |
| 5,857,865 A | | 1/1999 | Shimirak et al. | |
| 6,019,615 A | * | 2/2000 | Masuda ............... | H01R 9/0518 174/653 |
| 6,019,622 A | * | 2/2000 | Takahashi .............. | H01R 24/46 200/51.1 |

(Continued)

*Primary Examiner* — James Harvey
*Assistant Examiner* — Matthew T Dzierzynski
(74) *Attorney, Agent, or Firm* — Lee & Hayes, P.C.

(57) ABSTRACT

A connector (10), for example, an F-connector, has a barrel (12), which may be threaded, a front flange (14), a frame insert (16), a rear flange (20), a body section (22) between the frame insert (16) and the rear flange, an insulator (60) in the barrel, and a center conductor (24) running through the insulator. The body section forms a slot (18) between the frame insert and the rear flange. The rear flange has two sections (20A, 20B), which mirror each other. A section may be a rectangular block with a curved cutoff; the curved cutouts face each other and, together, provide a passageway for the conductor. The conductor is preferably beryllium-copper with a tin plating. The insulator is preferably a high-temperature thermoplastic, such as a heat-resistant polyamide nylon which can withstand a temperature of 270° C. for 1 minute.

20 Claims, 7 Drawing Sheets

(56) References Cited

U.S. PATENT DOCUMENTS

| | | | | |
|---|---|---|---|---|
| 6,071,144 | A * | 6/2000 | Tang | H01R 13/52 439/426 |
| 6,299,479 | B1 | 10/2001 | Tang | |
| 6,755,665 | B2 * | 6/2004 | Lu | H01R 9/0506 439/550 |
| 6,875,024 | B2 * | 4/2005 | Nagano | H01R 13/41 439/578 |
| 6,986,666 | B2 * | 1/2006 | Benson | H05K 9/0066 174/93 |
| 7,029,304 | B2 * | 4/2006 | Montena | H01R 9/0521 439/320 |
| 7,153,160 | B2 * | 12/2006 | Montena | H01R 9/0509 439/579 |
| 7,335,059 | B2 * | 2/2008 | Vaccaro | H01R 9/0521 439/578 |
| 7,404,738 | B2 * | 7/2008 | Montena | H01R 24/54 439/536 |
| 8,172,617 | B2 * | 5/2012 | Peng | H01R 24/44 439/620.03 |
| 8,556,654 | B2 | 10/2013 | Chastain et al. | |
| 8,920,193 | B2 * | 12/2014 | Riggsby | H01R 9/05 439/578 |
| 8,961,223 | B2 * | 2/2015 | Daughtry, Jr. | H01R 9/05 439/578 |
| 8,975,520 | B2 * | 3/2015 | Blake | H01R 13/6658 174/74 R |
| 9,017,102 | B2 * | 4/2015 | Natoli | H01R 9/0524 439/578 |
| 9,065,226 | B2 * | 6/2015 | Ando | H01R 13/74 |
| 9,130,288 | B2 * | 9/2015 | Holland | H01R 13/17 |
| 9,271,431 | B2 * | 2/2016 | Lee | H05K 9/0024 |
| 9,444,197 | B2 * | 9/2016 | Goebel | H01R 13/6581 |
| 9,590,287 | B2 * | 3/2017 | Burris | H01T 4/08 |
| 9,661,791 | B2 * | 5/2017 | Muterspaugh | H05K 9/006 |
| 9,748,704 | B2 * | 8/2017 | Wang | H01R 13/5205 |
| 9,948,039 | B2 * | 4/2018 | Carpenter | H01R 24/50 |
| 10,044,153 | B1 * | 8/2018 | Huang | H01R 13/41 |
| 10,224,650 | B2 * | 3/2019 | Shen | H01R 24/42 |
| 10,282,339 | B2 * | 5/2019 | Woosley | G06F 13/4068 |
| 10,530,072 | B2 * | 1/2020 | Alkan | H01R 9/00 |
| 10,594,094 | B2 * | 3/2020 | Fuller | H01R 24/38 |
| 2005/0085125 | A1 * | 4/2005 | Montena | H01R 9/0518 439/578 |
| 2006/0246774 | A1 * | 11/2006 | Buck | H01R 9/0521 439/578 |
| 2010/0315183 | A1 * | 12/2010 | Matsuzaki | H05K 5/0247 334/85 |
| 2013/0040481 | A1 * | 2/2013 | Vallely | H01R 13/111 439/312 |
| 2015/0140850 | A1 * | 5/2015 | Suzuki | H01R 13/5219 439/275 |
| 2019/0348736 | A1 * | 11/2019 | Alkan | H01R 24/42 |
| 2020/0007812 | A1 * | 1/2020 | Hino | H04N 5/64 |

* cited by examiner

SHEAR AND TORQUE RESISTANT F-CONNECTOR ASSEMBLY

CROSS-REFERENCE TO RELATED APPLICATION

This application claims the priority of U.S. Provisional Patent Application No. 62/726,678, filed Sep. 4, 2018, entitled "SHEAR AND TORQUE RESISTANT F-CONNECTOR ASSEMBLY, the entire disclosure and contents of which are incorporated herein by reference.

BACKGROUND

When cable is being tightened onto a connector on a device, or if a device having a connector is dropped, the connector may experience damage due to torque and shear forces.

SUMMARY

A connector is disclosed which has improved resistance to torque forces, such as may occur when a person is attaching and tightening a connecting cable to the connector, and improved resistance to shear forces, such as may occur when a device incorporating the connector is accidentally dropped.

DETAILED DESCRIPTION

A connector with improved resistance to torque and shear forces is disclosed, such as may occur when a person is attaching and tightening a connecting cable to the connector, and such as may occur when a device incorporating the connector is accidentally dropped. The disclosed embodiment is with respect to an F-connector, but the techniques described herein can be used with respect to other types of connectors as well.

Figure 1:
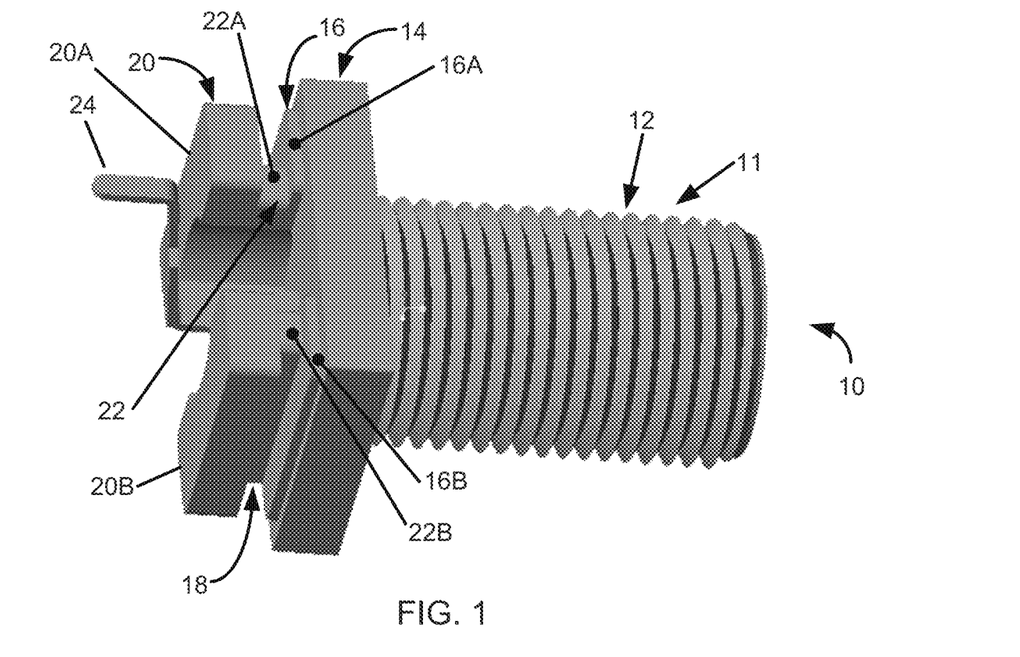
FIG. 1 illustrates an exemplary connector.

FIG. 1 illustrates an exemplary F-connector 10 having a connector body 11, a center conductor insulator 60 installed in the connector body 11, and a center conductor 24. The connector body has a barrel (shaft) 12, a front flange 14, a frame insert or shoulder 16, a rear flange 20, and a body section 22 between the frame insert 16 and the rear flange 20. The insulator 60 is installed in the barrel 12, and the conductor 24 runs through the insulator 60. The insulator 60 is best seen in FIGS. 7B, 7C, 8A, and 8C-8F. The barrel 12 may be threaded, as in the case of an F-connector. The body section 22, being smaller than the frame insert 16 and the rear flange 20, forms a slot 18 between the frame insert 16 and the rear flange 20.

The body insert 16 has two sections 16A, 16B, which mirror each other. The rear flange 20 has two sections 20A, 20B, which mirror each other. The body section 22 has two sections 22A, 22B, which mirror each other. A section 16A, 16B, 20A, 20B, 22A, 22B, may be described as being a rectangular block with a curved cutout in the center; the curved cutouts face each other and provide a passageway for the conductor 24.

The conductor 24 is insulated from the body section 22 via the insulator 60 in the threaded barrel 12. The threaded barrel 12, the front flange 14, the frame insert 16, the rear flange 20, and the body section 22 are preferably of a unitary construction, made of brass or ASTM B240 zinc allow with a nickel plating. The conductor 24 is preferably beryllium-copper with a tin plating. The insulator 60 is preferably a high-temperature thermoplastic, such as a heat-resistant polyamide nylon, such as a PAST product, and can withstand a temperature of 270° C. for 1 minute.

Figure 2:
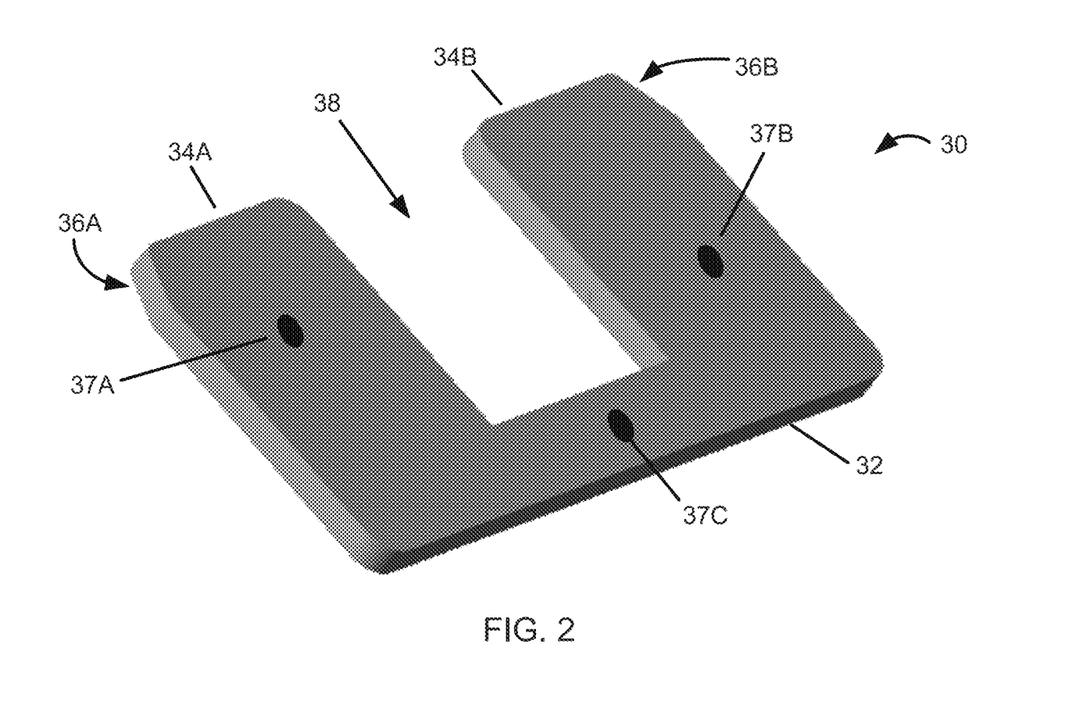
FIG. 2 illustrates an exemplary clip for the connector.

FIG. 2 illustrates an exemplary clip 30 for the connector 10. The clip 30 may also be considered to be a retainer or a bracket. The clip 30 is preferably U-shaped and has a top section 32 and two legs 34A, 34B extending from the top section 32, separated by a gap 38, and in the same plane as the top section 32. A leg 34A, 34B preferably, but not necessarily, also has a respective taper 36A, 36B, on its outside edge at the distal end, for ease of installation. The clip 30 fits into the slot 18. The gap 38 is preferably just large enough to accommodate the body section 22 of the connector body 11. In an alternative embodiment, the clip 30 only has a top section 32 which is pressed into the slot 18 and is then preferably soldered into place. The clip 30 is preferably cold rolled steel, copper alloy, zinc alloy, aluminum alloy, or brass.

Figure 3:
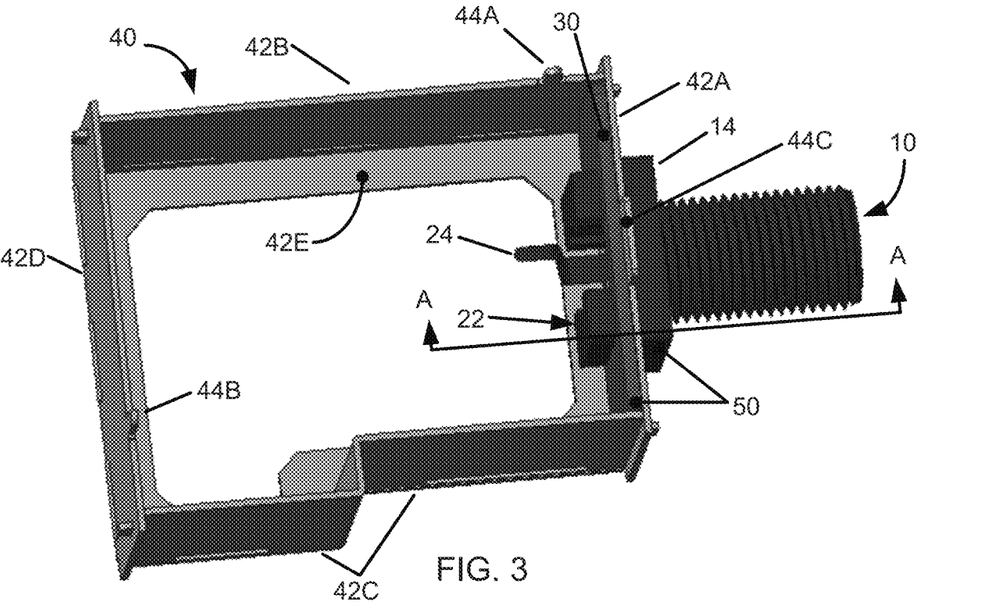
FIG. 3 illustrates an exemplary installation of a connector assembly.

FIG. 3 illustrates an exemplary installation of an F-connector assembly 50 comprising the connector 10 and the clip 30, on a shield 40. The shield 40 is also sometimes conventionally referred to as a "shield can," or a "shielding frame." One shape for the shield 40 is shown. Other shapes may be used, and may be preferable, depending upon the environment, the installation, and device in which the shield and connector assembly 50 is to be used. The shield 40 is shown from the underside. That is, in a typical installation, the mounting tabs 44A, 44B, 44C will be inserted into holes in a printed circuit board 62, and then soldered to the printed circuit board 62. (See FIGS. 8A-8D and. 9.) The shield 40 has a front wall 42A, side walls 42B, 42C, a rear wall 42D, and a top edge 42E. A top or lid (not shown) may be fastened to the shield 40 by soldering, clips, protrusions, or other fastening means. The shield 40, including the top or lid, and when mounted on a circuit board (not shown), performs as a radio frequency (RF) shield.

The connector 10, or the connector body 11, is inserted into apertures (cutouts, holes) 52A, 52B, and 54 (see FIG. 6) in the front wall 42A. The apertures 52A, 52B are positioned on opposite sides of the aperture 54. The clip 30 is then pressed into the slot 18 so that the clip 30 is secured in the slot 18 between the front wall 42A and the rear flange 20. The legs 34A, 34B of the clip 30 grip the body section 22, and the top section 32 of the clip 30 preferably presses against the body section 22 and the shield front wall 42A. The clip 30 is preferably secured in the slot 18 by solder or friction, and by the PCB 62 when the shield 40 is fastened onto the PCB 62. The insulator 60 and the conductor 24 may be installed into the connector body 11 either before or after the connector body 11 is secured to the shield 40.

In an embodiment, the clip 30 may be soldered to the shield front wall 42A and/or the rear flange 20 of the connector body 11. Also, in an embodiment, as in FIG. 2, the clip 30 may have one or more bosses 37A, 37B, 37C on the legs 34A, 34B and/or the top section 32. The one or more bosses 37 press against the front (interior) side of the rear flange sections 20A, 20B and/or the rear (interior) side of the front wall 42A to further secure the clip 30 in the slot 18.

Figure 4:
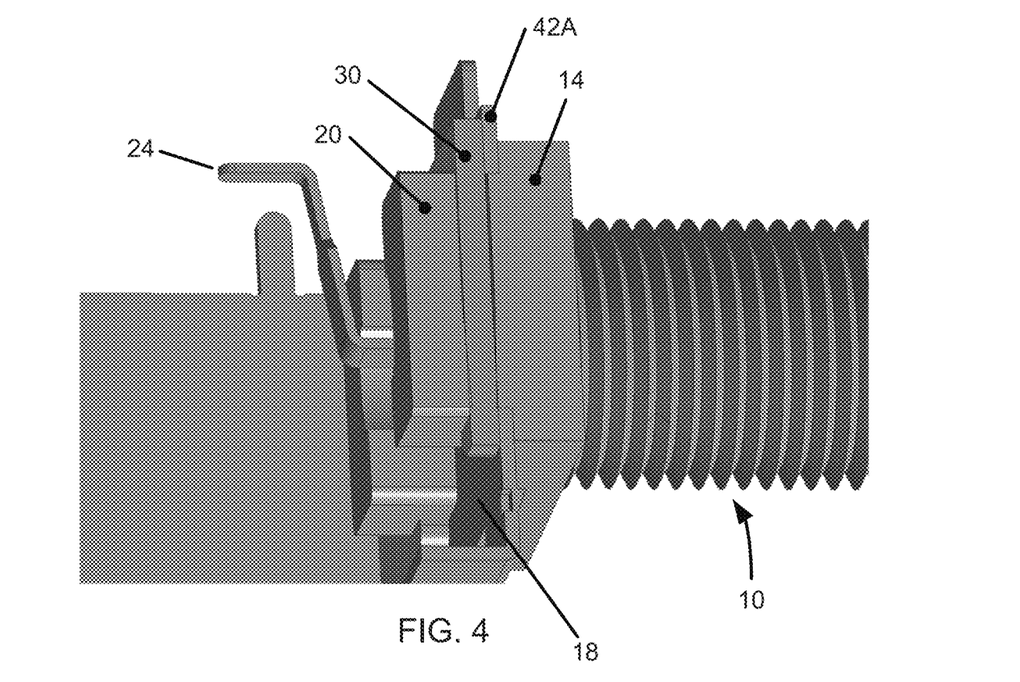
FIG. 4 is a cutaway view along lines A-A of FIG. 3.

FIG. 4 is a cutaway view along lines A-A of FIG. 3 and shows the clip 30 inserted into the slot 18 of the connector assembly 50.

Figure 5:
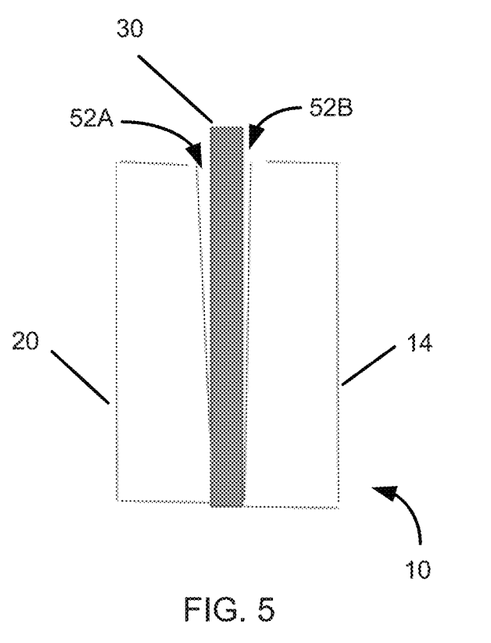
FIG. 5 illustrates a modification to the connector assembly.

FIG. 5 illustrates a modification to the connector body 11. The interior side (facing the slot 18 (see FIG. 1)) of the front flange 14, the interior side (facing the slot 18) of the rear flange 20, and/or the back side of the frame insert 16, is chamfered (tapered) so that the slot 18 becomes narrower toward the bottom of the slot. This also helps to secure the clip 30 in the slot 18.

Figure 6:
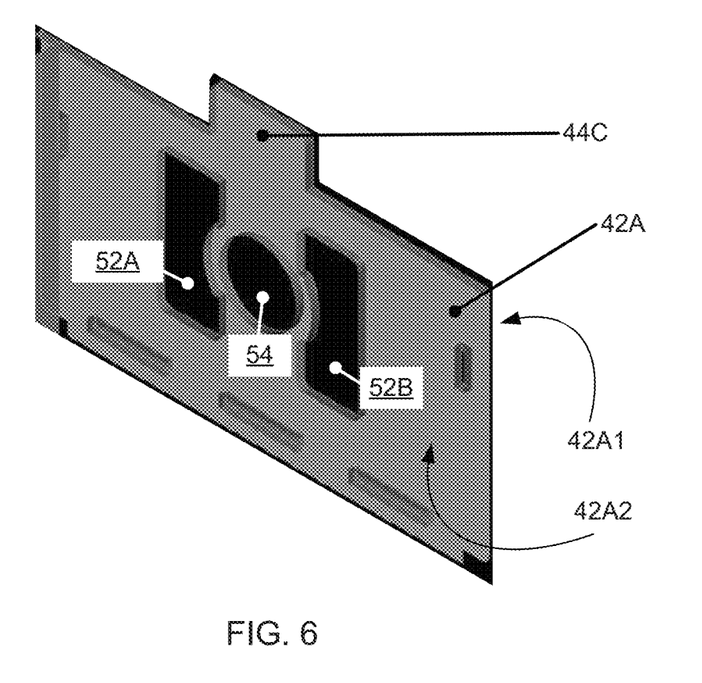
FIG. 6 illustrates an exemplary front wall of an exemplary shield.

FIG. 6 illustrates an exemplary front wall 42A of the exemplary shield 40. The front wall 42A has a front side 42A1, a rear side 42A2, a tab 44C and apertures 52A, 52B, and 54. Apertures 52A. 52B are sized to allow the frame insert 16 and the rear flange 20 to pass through, but are smaller than the front flange 14 so that the front flange 14 cannot pass through. The apertures 54 is sized to accommodate the conductor 24 and the insulator 60.

The body section 22 is smaller than the front flange 14 and smaller than the rear flange 20 so as to form a slot 18 between the front flange 14 and frame insert 16 on one side, and the rear flange 20 on the other side. The rear flange 20 and frame insert 16 have approximately the same height, width, and shape, so that they will fit through the apertures 52A, 52B in the front wall 42A. The height and width of the front flange 14 are greater than the height and width of the rear flange 20 and frame insert 16 so that the front flange 14 will not fit through the apertures 52A, 52B. The frame insert 16 preferably has a thickness approximately the same as, but not greater than, the thickness of the front wall 42A so that the front flange 14, the front wall 42A, the clip 30, and the rear flange 20 do not have any "play" or space between them once the connector body 11 is inserted into the front wall 42A and the clip 30 is pressed into the slot 18. It is preferred that the front flange 14 be soldered to the front side of the front wall 42A, and that the rear flange 20 and the clip 30 be soldered together and to the back side of the front wall 42A.

The front flange 14, the rear flange 20, and the clip 30 provide for spreading shear and torque forces over a large area of the shield 40, thereby reducing the likelihood that shear and torque forces will detach the barrel 12 from the connector 10, or detach the connector 10 from the shield 40, or detach the connector 10 from the PCB 62. Thus, the front flange 14, the rear flange 20, and the clip 30 provide for increased shear and torque resistance as compared with conventional connector, especially conventional F-connectors.

In testing, a shearing force of 25 pounds (111 Newtons), when applied to the barrel 12, did not detach the threaded barrel 12 from the connector 10, nor detach the connector 10 from the shield 40. A pull force of 135 pounds (600 Newtons), when applied to the barrel 12, did not detach the barrel 12 from the connector 10, nor detach the connector 10 from the shield 40. A torque (rotational) force of 35 inch-pounds did not detach the barrel 12 from the connector 10 nor detach the connector 10 from the shield 40.

Figure 7A:
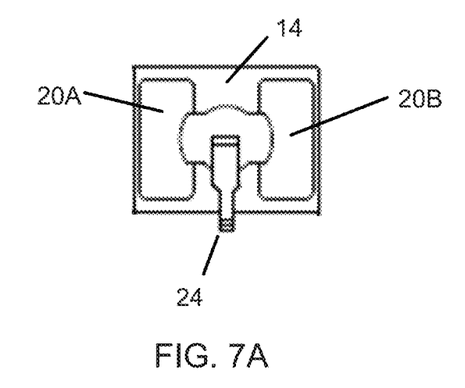
FIG. 7A illustrates a rear view of an exemplary embodiment of a connector.

FIG. 7A illustrates a rear view of an exemplary embodiment of a connector 10. The front flange 14 has a width of 14 mm and a height of 11 mm. Also shown are the rear flange sections 20A, 20B. In this view, the frame insert sections 16A, 16B, and the body sections 22A, 22b, are hidden behind the frame insert sections 16A 16B, respectively.

Figure 7B:
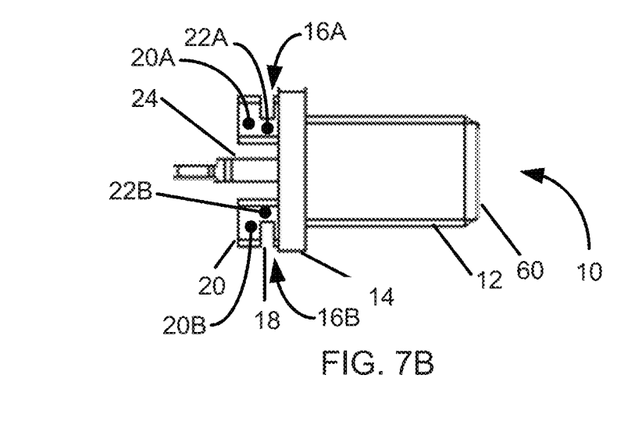
FIG. 7B illustrates a top view of the exemplary embodiment of the connector.

FIG. 7B illustrates a top view of the exemplary embodiment of the connector 10. The front flange 14 has a depth of 2.5 mm, the conductor 24 has a width of 2 mm near the front flange 14 and narrows to a width of 1 mm at its distal end. The barrel 12 threading is ⅜-32UNEF-2A. Also shown are the frame inserts sections 16A, 16B, the rear flange sections 20A, 20B, the body sections 22A, 22B, and the slot 18.

Figure 7C:
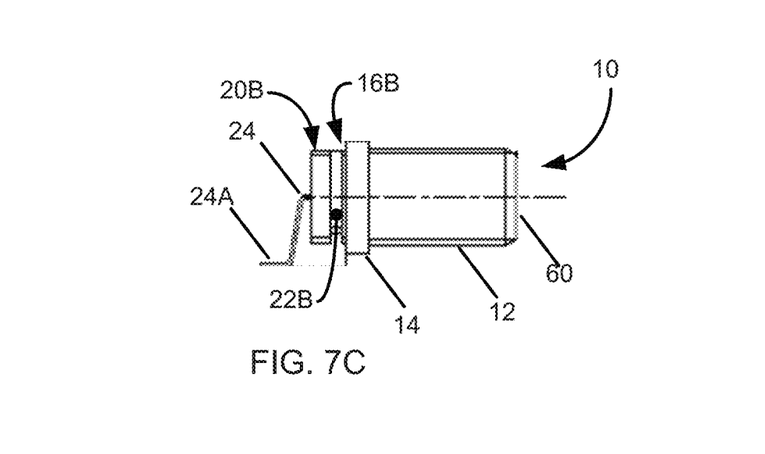
FIG. 7C illustrate a side view of the exemplary embodiment of the connector.

FIG. 7C illustrates a view of the exemplary embodiment of the connector. The distance from the front face of the insulator 60 to the rear side of the front flange 14 is 17.4 mm. The contact portion 24A of the conductor 24 has a length of 3.25 mm and is 6.8 mm below the portion of the conductor 24 which passes through the insulator 60. The conductor 24, 24A extends 8.7 mm beyond the back side of the front flange 14. Also shown are the frame insert section 16B, the rear flange section 22B, and the body section 22B.

FIGS. 8A-8F illustrate several views of an exemplary embodiment of a shield 40 for use with a connector assembly 50. The shape of the shield 40, and the dimensions indicated, are for use in an exemplary implementation and should not be considered to be required for any application. FIGS. 8A-8D show slots 66 which may be used to secure the lid to the shield 40.

Figure 8A:
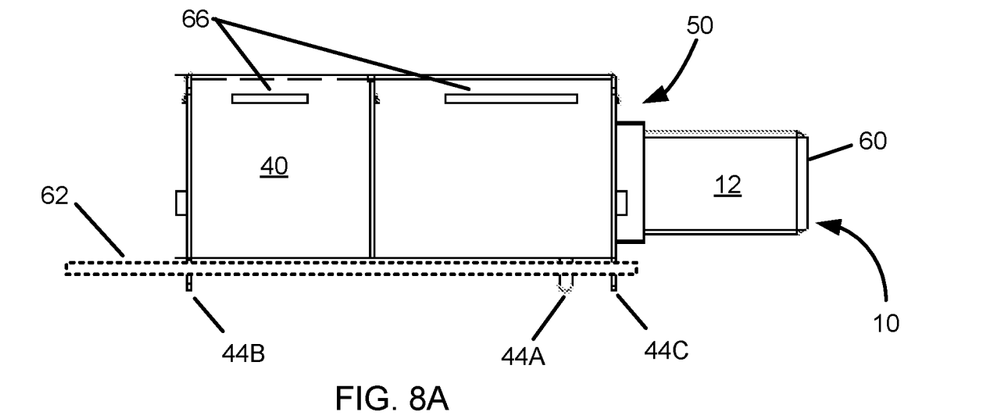
FIG. 8A is a view of one side of the shield with the connector assembly installed.

FIG. 8A is a view of one side of the shield 40 with the connector assembly 50 installed. The shield 40 preferably has a height of 16.7 mm and a thickness of 0.5 millimeter. The shield 40 is preferably SPTE #50, T3. The connector 10 is preferably swaged onto the front wall 42A within 1.5 degrees of normal to the front wall 42A.

Figure 8B:
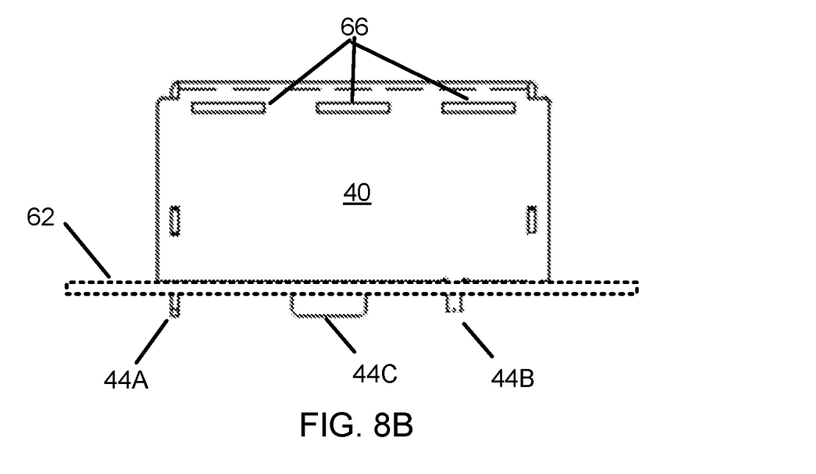
FIG. 8B is a rear view of the shield.

FIG. 8B is a rear view of the shield 40. The tabs 44A, 44B have a width of 1.2 mm. Tab 44B is set in 6.58 mm from the intersection of the shield walls 42C and 42D (FIG. 3).

Figure 8C:
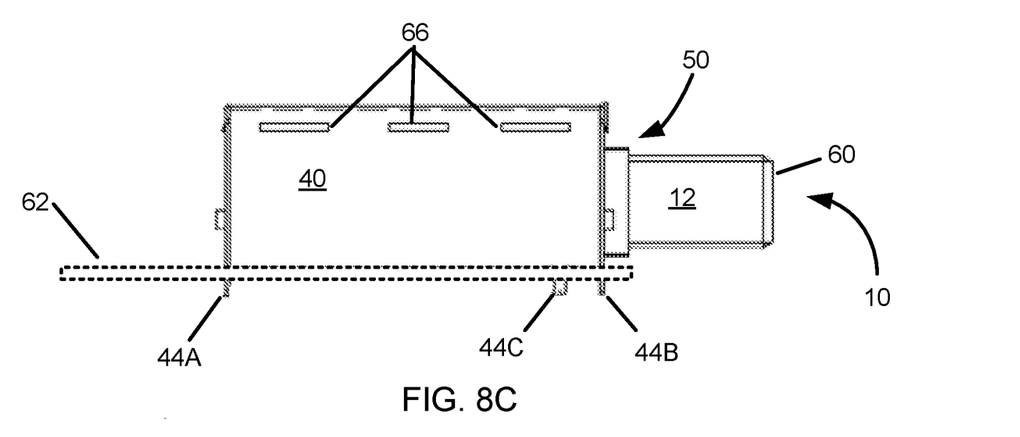
FIG. 8C is a view of another side of the shield with the connector assembly installed.

FIG. 8C is a view of another side of the shield 40 with the connector assembly 50 installed. The tabs 44A, 44C have a length of 3.00 mm. The distance between the center of tab 44B and the center of 44C is 4.3 mm.

Figure 8D:
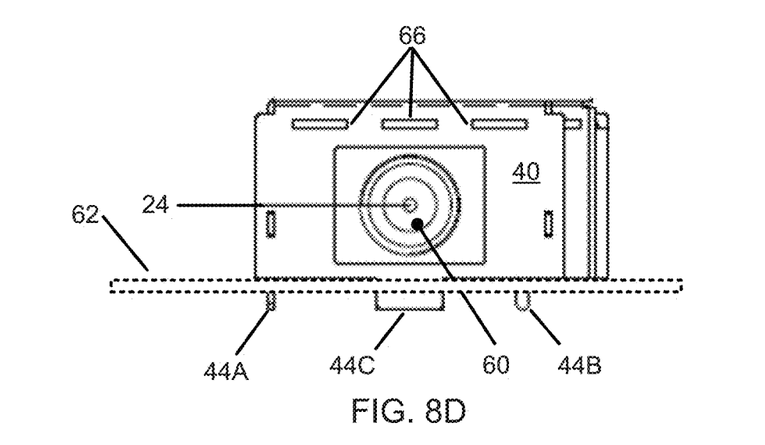
FIG. 8D is a front view of the shield with the connector assembly installed.

FIG. 8D is a front view of the shield 40 with the connector assembly 50 installed. The distance between the bottom edge of the shield 40 and the center of the conductor 24 is 6.8 mm; the width of tab 44C is 6.2 mm, and the distance between the center of tab 44A and the closer edge of tab 44C is 9.9 mm.

Figure 8E:
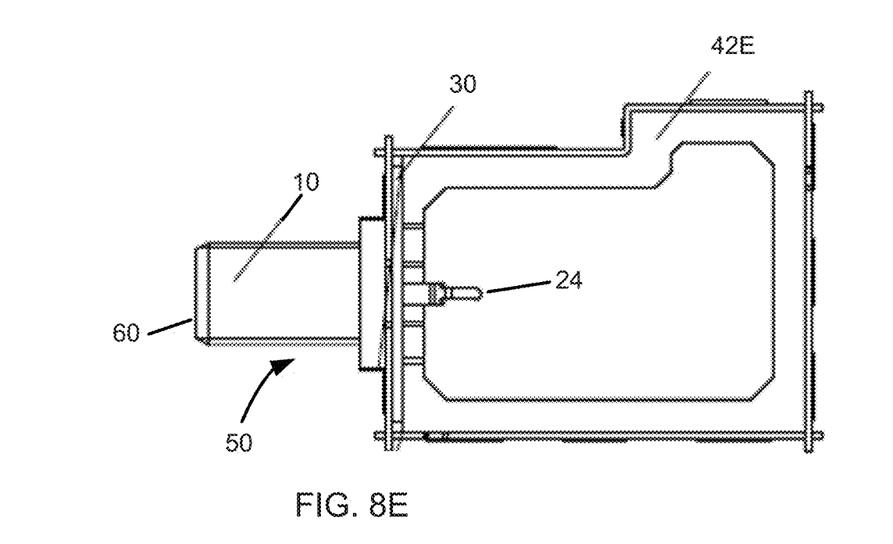
FIG. 8E is a bottom view of the shield with the connector assembly installed.

FIG. 8E is a bottom view of the shield 40 with the connector assembly 50 installed. The clip 30 is preferably soldered onto the shield 40.

Figure 8F:
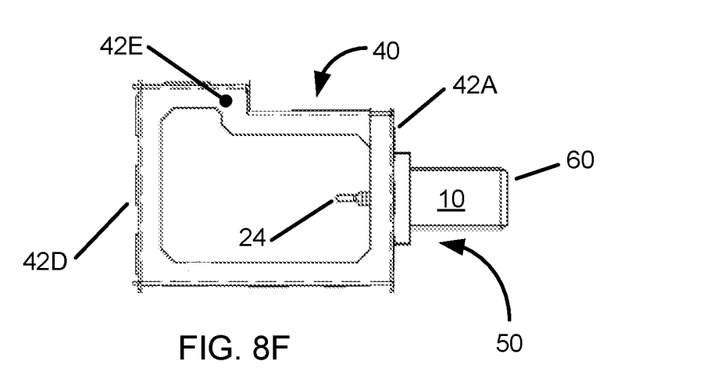
FIG. 8F is a top view of the shield without a cover or lid installed.

FIG. 8F is a top view of the shield 40 without a cover or lid installed. The width of the shield 40 at the front wall 42A is 26.5 mm, and the width of the shield 40 at the rear wall 42D is 30.63 mm. The length of the shield 40 is 39 mm and the length of the front section of the side wall 42C is 21.85 mm. As shown in FIG. 3, the shield 40 comprises several sections 42A-42E, and the sections are preferably soldered together at corners and seams. Also, the connector 10 is soldered to the shield 40.

Figure 9:
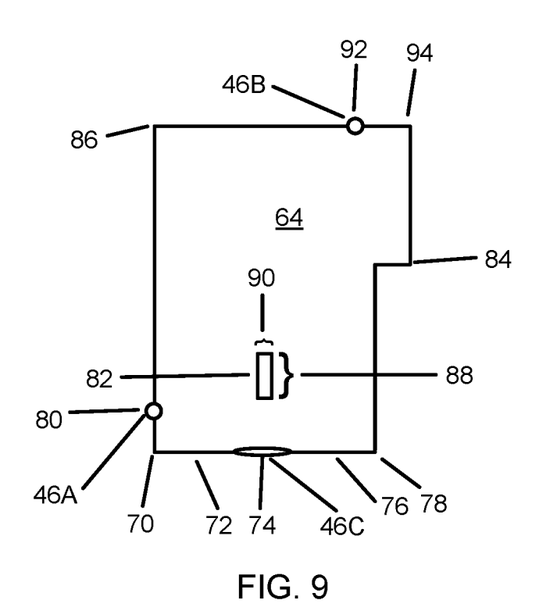
FIG. 9 illustrates an exemplary printed circuit board (PCB) layout for the mounting of the shield onto a PCB

FIG. 9 illustrates an exemplary printed circuit board (PCB) layout 64 for the mounting of the shield 40 onto the PCB 62 (not shown in FIG. 9). Slots or holes 46A-46C are shown for the insertion of the tabs 44A-44C, respectively. Starting at point 70, the horizontal dimensions to the several points are as follows: 72-9.9 mm; 74-13 mm; 76-16.1 mm; 78-26 mm; 92-23.55 mm; and 94-30.13 mm. Again starting at point 70, the vertical dimensions to the several points are as follows: 80-4.3 mm; 82-6.85 mm; 84-21.85 mm; and 86-38.5 mm. Dimension 88 is 4.06 mm. Dimension 90 is 1.5 mm. The holes 46A and 46B have a diameter of 1.5 mm.

Thus, a connector body 11 has been disclosed for use with a shield 40 having first, second, and third apertures, the second and third apertures 52A, 52B being on opposite sides of the first aperture 54. The connector body comprises a barrel 12 having a front end and a back end, a front flange 14 having a front side and a back side, the front side being joined to the back end of the barrel, a frame insert 16 having a front side and a back side, the front side of the frame insert being joined to the back side of the front flange, the frame insert being dimensioned to fit into the second and third apertures of the shield, a rear flange 20 having a front side and a back side, the rear flange being dimensioned to fit through the second and third apertures of the shield, a body section 22 between the back side of the frame insert and the front side of the rear flange, dimensioned to fit through the second and third apertures of the shield, and dimensioned to form a slot 18 between the frame insert and the rear flange.

A connector assembly 10 for use with the above shield has also been disclosed. The connector assembly 10 comprises the connector body 11 above, an insulator 60 in the barrel 12, a conductor 24 centered in the insulator 60, the conductor 24 extending from near the front end of the barrel 12, through the insulator 60, to at least the back side of the front flange 14, and a clip 30 dimensioned to fit into the slot.

Also, a shielded connector assembly 50 has been disclosed. The shielded connector assembly comprises the connector assembly 10 above and a shield 40, the shield having first, second, and third apertures, the second and third apertures 52A, 52B being on opposite sides of the first aperture 54.

The connector body 11 may be, and preferably is, a unitary structure.

The frame insert 16 preferably has a left side and a right side 16A, 16B, the left side and the right side each being an approximately rectangular block with a curved cutout in the block, the curved cutout of the left side facing the curved cutout of the right side, and the curved cutout of the left side and the curved cutout of the right side providing a passageway for the conductor.

The body section 22 preferably has a left side and a right side 22A, 22B, the left side and the right side each being an approximately rectangular block with a curved cutout in the block, the curved cutout of the left side facing the curved cutout of the right side, and the curved cutout of the left side and the curved cutout of the right side providing a passageway for the conductor.

The rear flange 20 preferably has a left side and a right side 20A, 20B, the left side and the right side each being an approximately rectangular block with a curved cutout in the block, the curved cutout of the left side facing the curved cutout of the right side, and the curved cutout of the left side and the curved cutout of the right side providing a passageway for the conductor.

The clip 30 is preferably approximately U-shaped.

The clip 30 preferably has at least one boss 37, the at least one boss engaging the rear flange 20.

The clip 30 is preferably soldered to the connector body 11 after the clip 30 is inserted into the slot 18.

The barrel 12 is preferably threaded.

The front side of the rear flange 20 is preferably chamfered.

All dimensions are in millimeters unless otherwise stated.

Although the preferred implementation is with respect to an F-connector, that is merely a preference, and is not a limitation, and the term "connector" as used herein also includes other types of shield-mount or chassis-mount connectors.

The term "exemplary" is used herein to mean serving as an example, instance, or illustration. Any aspect or design described herein as "exemplary" is not necessarily to be construed as preferred or advantageous over other aspects or designs. Similarly, examples are provided herein solely for purposes of clarity and understanding and are not meant to limit the subject innovation or portion thereof in any manner. It is to be appreciated that additional or alternate examples might have been presented, but omitted for purposes of brevity.

The singular forms "a," "an," and "the" are intended to include the plural forms as well, unless expressly stated otherwise or the context indicates otherwise.

The phrases "for example" and "such as" mean "by way of example and not of limitation." The subject matter described herein is provided by way of illustration for the purposes of teaching, suggesting, and describing, and not as limiting or restricting. Combinations and alternatives to the illustrated embodiments are contemplated, described herein, and set forth in the claims.

For convenience of discussion herein, when there is more than one of a component, that component may be referred to herein either collectively or singularly by the singular reference numeral unless expressly stated otherwise or the context indicates otherwise. For example, components 20 (plural) or component 20 (singular) may be used unless a specific component is intended.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. For brevity and/or clarity, well-known functions or constructions may not be described in detail herein.

The terms "includes," "has," "comprises," and variations in form thereof, whether used in this specification or in the claims, should be construed as being inclusive and open-ended in a manner similar to the term "comprises" as that term is construed when employed as a transitional word in a claim. Those terms may therefore specify the presence of stated features, steps, operations, elements, and/or components but do not necessarily preclude the presence or addition of one or more other features, steps, operations, elements, components, and/or groups thereof.

When a component is referred to as being "connected" or "coupled" to another component, it may be connected or coupled directly, or indirectly, such as when one or more intervening components are present.

The term "and/or" includes any and all combinations of one or more of the associated listed items.

Phrases such as "between X and Y" and "between about X and Y" should be interpreted to include both X and Y unless otherwise specifically noted.

Terms such as "about", "approximately", and "substantially" are relative terms and indicate that, although a value as used in a process or apparatus may not be exactly the same as a value as stated in the specification or a claim, those values are still "about", "approximately", or "substantially" the same if their difference is such that the process or apparatus still provides the indicated or desired result, or that the operation of a process or apparatus is not adversely affected to the point where it cannot perform its intended purpose. As an example, and not as a limitation, if a height of approximately "X" inches is recited, a lower or higher height "Y" is still "about", "approximately", or "substantially" "X" inches if the desired function can still be performed or the desired result can still be achieved.

The terms vertical, horizontal, upper, lower, bottom, top, and the like, as they may be used herein, are used for convenience in referencing the drawing and, unless otherwise indicated or required by context, do not denote a required orientation.

The subject matter described above is provided by way of illustration only and should not be construed as limiting.

The different advantages and benefits disclosed and/or provided by the implementation(s) disclosed herein may be used individually or in combination with one, some or possibly even all of the other benefits. Furthermore, not every implementation, nor every component of an implementation, is necessarily required to obtain, or necessarily required to provide, one or more of the advantages or benefits of the implementation. Furthermore, the claimed subject matter is not limited to implementations that solve any or all disadvantages noted in any part of this disclosure.

Conditional language, such as "can", "could", "might", or "may" is generally intended to convey that certain embodiments preferably or optionally include certain features, elements and/or steps, while some other embodiments optionally do not include those certain features, elements and/or steps, unless specifically stated otherwise, or otherwise differently understood within the context as used. Thus, such conditional language indicates, in general, that those features, elements and/or step may not be required for every implementation or embodiment.

What has been described above includes examples of aspects of the claimed subject matter. It is generally not possible to describe every conceivable combination of components or methodologies for purposes of describing the claimed subject matter, but one of ordinary skill in the art will recognize that various, and possibly even many, modifications may be made to the implementation(s) disclosed herein without departing from the scope or spirit of the claimed subject matter. Accordingly, the disclosed subject matter is intended to embrace all such modifications that fall within the spirit and scope of the appended claims.

I claim:

1. A connector assembly for use with a shield having first, second, and third apertures, the second and third apertures being on opposite sides of the first aperture, the connector assembly comprising:
   a connector body comprising:
      a barrel having a front end and a back end;
      a front flange having a front side and a back side, the front side being joined to the back end of the barrel;
      a frame insert having a front side and a back side, the front side of the frame insert being joined to the back side of the front flange, the frame insert being dimensioned to fit into the second and third apertures of the shield;
      a rear flange having a front side and a back side, the rear flange being dimensioned to fit through the second and third apertures of the shield;
      a body section between the back side of the frame insert and the front side of the rear flange, dimensioned to fit through the second and third apertures of the shield, and dimensioned to form a slot between the frame insert and the rear flange;
   an insulator in the barrel;
   a conductor centered in the insulator, the conductor extending from near the front end of the barrel, through the insulator, to at least the back side of the front flange; and
   a clip dimensioned to fit into the slot.

2. The connector assembly of claim 1, wherein the connector body is a unitary structure.

3. The connector assembly of claim 1, wherein the frame insert has a left side and a right side, the left side and the right side each being an approximately rectangular block with a curved cutout in the block, the curved cutout of the left side facing the curved cutout of the right side, and the curved cutout of the left side and the curved cutout of the right side providing a passageway for the conductor.

4. The connector assembly of claim 1, wherein the body section has a left side and a right side, the left side and the right side each being an approximately rectangular block with a curved cutout in the block, the curved cutout of the left side facing the curved cutout of the right side, and the curved cutout of the left side and the curved cutout of the right side providing a passageway for the conductor.

5. The connector assembly of claim 1, wherein the rear flange has a left side and a right side, the left side and the right side each being an approximately rectangular block with a curved cutout in the block, the curved cutout of the left side facing the curved cutout of the right side, and the curved cutout of the left side and the curved cutout of the right side providing a passageway for the conductor.

6. The connector assembly of claim 1, wherein the clip is approximately U-shaped.

7. The connector assembly of claim 1, wherein the clip has at least one boss, the at least one boss engaging the rear flange.

8. The connector assembly of claim 1, wherein the clip is soldered to the connector body after the clip is inserted into the slot.

9. The connector assembly of claim 1, wherein the barrel is threaded.

10. The connector assembly of claim 1, wherein the front side of the rear flange is chamfered.

11. A connector body for use with a shield having first, second, and third apertures, the second and third apertures being on opposite sides of the first aperture, the connector body comprising:
   a barrel having a front end and a back end;
   a front flange having a front side and a back side, the front side being joined to the back end of the barrel;
   a frame insert having a front side and a back side, the front side of the frame insert being joined to the back side of the front flange, the frame insert being dimensioned to fit into the second and third apertures of the shield;

a rear flange having a front side and a back side, the rear flange being dimensioned to fit through the second and third apertures of the shield; and a body section between the back side of the frame insert and the front side of the rear flange, dimensioned to fit through the second and third apertures of the shield, and dimensioned to form a slot between the frame insert and the rear flange.

12. The connector body of claim 11, wherein the connector body is a unitary structure.

13. The connector body of claim 11, wherein the frame insert has a left side and a right side, the left side and the right side each being an approximately rectangular block with a curved cutout in the block, the curved cutout of the left side facing the curved cutout of the right side, and the curved cutout of the left side and the curved cutout of the right side forming a passageway.

14. The connector body of claim 11, wherein the body section has a left side and a right side, the left side and the right side each being an approximately rectangular block with a curved cutout in the block, the curved cutout of the left side facing the curved cutout of the right side, and the curved cutout of the left side and the curved cutout of the right side forming a passageway.

15. The connector body of claim 11, wherein the rear flange has a left side and a right side, the left side and the right side each being an approximately rectangular block with a curved cutout in the block, the curved cutout of the left side facing the curved cutout of the right side, and the curved cutout of the left side and the curved cutout of the right side forming a passageway.

16. The connector body of claim 11, wherein the barrel is threaded.

17. The connector body of claim 11, wherein the front side of the rear flange is chamfered.

18. A shielded connector assembly comprising:
   a shield comprising a front wall, a back wall, a left wall, a right wall, and a lid;
   the front wall having first, second, and third apertures, the second and third apertures being on opposite sides of the first aperture;
   the shield having at least two mounting tabs extending from at least two of the back wall, the left wall, or the right wall;
   the shield having a mounting tab extending from the front wall;
   a connector body comprising:
      a barrel having a front end and a back end;
      a front flange having a front side and a back side, the front side being joined to the back end of the barrel;
      a frame insert having a front side and a back side, the front side of the frame insert being joined to the back side of the front flange, the frame insert being dimensioned to fit into the second and third apertures of the shield;
      a rear flange having a front side and a back side, the rear flange being dimensioned to fit through the second and third apertures of the shield;
      a body section between the back side of the frame insert and the front side of the rear flange, dimensioned to fit through the second and third apertures of the shield, and dimensioned to form a slot between the frame insert and the rear flange;
   an insulator in the barrel;
   a conductor centered in the insulator, the conductor extending from near the front end of the barrel, through the insulator, to at least the back side of the front flange; and
   a clip dimensioned to fit into the slot; and
   wherein the clip is soldered to the connector body after the clip is inserted into the slot.

19. The shielded connector assembly of claim 18, wherein the clip is also soldered to the connector body.

20. The shielded connector assembly of claim 18, wherein the connector body is a unitary structure.

\* \* \* \* \*